United States Patent
Arakawa et al.

(10) Patent No.: US 9,397,562 B1
(45) Date of Patent: Jul. 19, 2016

(54) NEGATIVE REFERENCE VOLTAGE GENERATING CIRCUIT AND SYSTEM THEREOF

(71) Applicant: Powerchip Technology Corporation, Hsinchu (TW)

(72) Inventors: Hideki Arakawa, Tokyo (JP); Nobuhiko Ito, Tokyo (JP); Teruaki Maeda, Tokyo (JP)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 14/718,100

(22) Filed: May 21, 2015

(30) Foreign Application Priority Data

Jan. 13, 2015 (JP) .................................. 2015-004352

(51) Int. Cl.
| | |
|---|---|
| *H02M 3/07* | (2006.01) |
| *H02M 3/156* | (2006.01) |
| *G11C 5/14* | (2006.01) |
| *G05F 3/26* | (2006.01) |

(52) U.S. Cl.
CPC ............... *H02M 3/156* (2013.01); *G05F 3/267* (2013.01); *G11C 5/147* (2013.01); *H02M 3/07* (2013.01)

(58) Field of Classification Search
CPC ........... H02M 3/156; H02M 3/07; G05F 3/30; G05F 3/222; G05F 3/225; G05F 3/267; G11C 5/147
See application file for complete search history.

(56) References Cited

U.S. PATENT DOCUMENTS

| | | | |
|---|---|---|---|
| 7,639,059 | B1 | 12/2009 | Yu et al. |
| 2003/0042938 | A1 | 3/2003 | Shvarts |
| 2004/0233600 | A1 | 11/2004 | Yoshida et al. |
| 2005/0134246 | A1 | 6/2005 | Tobita |
| 2006/0220634 | A1* | 10/2006 | Ito ........................ G05F 3/222 323/313 |
| 2007/0030053 | A1* | 2/2007 | Pan ........................ G05F 3/30 327/539 |
| 2007/0052473 | A1* | 3/2007 | McLeod ................ G05F 3/30 327/539 |
| 2008/0018318 | A1 | 1/2008 | Hsu |
| 2009/0015299 | A1 | 1/2009 | Ryu et al. |
| 2009/0243709 | A1 | 10/2009 | Pan |
| 2012/0218032 | A1 | 8/2012 | Nadimpalli |
| 2014/0159699 | A1 | 6/2014 | Iguchi et al. |

FOREIGN PATENT DOCUMENTS

| | | |
|---|---|---|
| CN | 101930248 | 12/2010 |
| JP | 58-096317 | 6/1983 |
| JP | 2004350290 | 12/2004 |

(Continued)

*Primary Examiner* — Jung Kim
(74) *Attorney, Agent, or Firm* — Jianq Chyun IP Office

(57) ABSTRACT

A negative reference voltage generating circuit generating a negative reference voltage is provided, including a differential amplifier, a first diode, second diodes, and a third resistor. The differential amplifier includes a non-inverting input terminal, an inverting input terminal, and an output terminal, and is driven by a positive and a negative power voltages. The output terminal is connected with the non-inverting input terminal via a first resistor and connected with the inverting input terminal via a second resistor. The first diode includes a cathode connected with the non-inverting input terminal of the differential amplifier and an anode connected with a ground. The second diodes respectively include a cathode connected with a predetermined connection point and an anode connected with the ground, and are connected in parallel. The third resistor is connected between the connection point and the inverting input terminal of the differential amplifier.

14 Claims, 11 Drawing Sheets

(56) References Cited

FOREIGN PATENT DOCUMENTS

| JP | 2005184455 | 7/2005 |
| JP | 2006286678 | 10/2006 |
| JP | 2009016929 | 1/2009 |
| JP | 2009074973 | 4/2009 |
| JP | 2014115861 | 6/2014 |
| TW | 201342482 | 10/2013 |
| TW | 201443602 | 11/2014 |

* cited by examiner

NEGATIVE REFERENCE VOLTAGE GENERATING CIRCUIT AND SYSTEM THEREOF

CROSS-REFERENCE TO RELATED APPLICATION

This application claims the priority benefit of Japan application serial no. 2015-004352, filed on Jan. 13, 2015. The entirety of the above-mentioned patent application is hereby incorporated by reference herein and made a part of this specification.

BACKGROUND OF THE INVENTION

1. Field of the Invention

The invention relates to a negative reference voltage generating circuit that is, for example, used in a NOR type flash memory and generates a negative reference voltage, and a negative reference voltage generating system using the negative reference voltage generating circuit.

2. Description of Related Art

FIG. 7A and FIG. 7B are vertical cross-sectional views of a NOR type flash memory cell of Conventional Example 1, which show the voltage relationship required for performing Fowler-Nordheim programming/erasing operations at the maximum voltage of 18V or 10V. In FIG. 7A and FIG. 7B, 100 represents a semiconductor substrate, 101 represents a control gate, 102 represents a source, 103 represents a drain, and 104 represents a floating gate.

For example, a NOR type flash memory requires high speed performance during random access, and as shown in FIG. 7A and FIG. 7B, for the programming/erasing operations, a positive intermediate voltage, such as 10V, and a negative intermediate voltage, such as −8V, are used in place of a positive high voltage. By using the positive intermediate voltage and the negative intermediate voltage, the metal-oxide-semiconductor (MOS) transistor used in the peripheral circuit exhibits better performance than a high voltage transistor. It is because that a thin gate oxide film and a short gate length can be used.

In order to generate the positive voltage, generally a bandgap reference (BGR) voltage generating circuit is used, for example, in the peripheral circuit of a NAND type flash memory.

PRIOR ART LITERATURE

Patent Literature 1: Specification of US Patent Publication No. 2012/0218032
Patent Literature 2: Japanese Patent Publication No. 2009-016929
Patent Literature 3: Japanese Patent Publication No. 2009-074973
Patent Literature 4: Specification of US Patent Publication No. 2008/0018318

For generating a negative voltage, however, instead of using the BGR voltage generating circuit that generates a negative voltage, generally the BGR voltage generating circuit of the positive voltage, as shown in FIG. 8 and FIG. 9, is used to generate a negative voltage reference.

FIG. 8 is a circuit diagram showing a structure of a negative voltage generator of Conventional Example 2, as disclosed in Patent Literature 1. In FIG. 8, the negative voltage generator includes resistors R21 and R22, a differential amplifier 20, and a charge pump 21. Here, Vdd represents a positive power voltage, Vss represents a ground voltage, and a positive power voltage Vpp applied to the resistor R21 is regulated according to a positive reference voltage PVref. A negative voltage Vneg generated by the negative voltage generator of FIG. 8 is represented by the following equation.

$$Vneg = -R22/R21 \Delta Vpp + (1 + R22/R21) \times PVref \quad (1)$$

FIG. 9 is a circuit diagram showing a structure of the negative voltage generating circuit of Conventional Example 3, as disclosed in Patent Literatures 2 and 3. In FIG. 9, the negative voltage generating circuit includes differential amplifiers 31 and 32, P channel MOS transistors (referred to as PMOS transistors hereinafter) P31 and P32, resistors R31 and R32, and a charge pump 33. Here, Vdd represents the positive power voltage and Vss represents the ground voltage. The PMOS transistors P31 and P32 constitute a current mirror circuit and respectively cause the same reference current Iref to flow through the resistors R31 and R32. The negative voltage Vneg generated by the negative voltage generating circuit of FIG. 9 is represented by the following equation.

$$Vneg = -Iref \times R32 + PVref \quad (2)$$

$$Iref = PVref/R31 \quad (3)$$

However, it is considered that, if the negative reference voltage NVref can be used, the negative voltage Vneg can be generated more accurately and the circuit structure can be simplified. In order to generate the negative voltage Vneg equal to −10V (Vneg=−10V), if the negative reference voltage NVref is equal to −1.0V+ 0.1V (NVref=−1.0V±0.1V), the negative voltage Vneg is controlled to be −10V±1V by a ten times error. Thus, the negative voltage generating circuit requires the same accuracy as the BGR voltage generating circuit, that is ±0.01V.

FIG. 10 is a circuit diagram showing a structural example of the negative voltage generating circuit using this concept, which has the same structure as a positive boost voltage generating circuit that uses a positive reference voltage. The negative voltage generating circuit of FIG. 10 includes resistors R41 and R42, a differential amplifier 41, and a charge pump 42. In FIG. 10, the resistors R41 and R42 that constitute a dividing circuit can be replaced by a series circuit of two capacitors. Here, the negative voltage generated by the negative voltage generating circuit of FIG. 10 is represented by the following equation.

$$Vneg = (R42/R41 + 1) \times NVref \quad (4)$$

The issue is to realize a circuit that accurately generates the negative reference voltage NVref. FIG. 11 is a circuit diagram showing a structure of the negative reference voltage generating circuit of Conventional Example 4. The negative reference voltage generating circuit of FIG. 11 includes a current source 50 that generates the reference current Iref based on the positive reference voltage PVref, resistors R51 and R52, and N channel MOS transistors (referred to as NMOS transistors hereinafter) N51 and N52. The negative reference voltage NVref generated by the negative reference voltage generating circuit of FIG. 11 is represented by the following equation.

$$NVref = -Iref \times R52 \quad (5)$$

FIG. 12 is a circuit diagram showing a structure of the negative reference voltage generating circuit of Conventional Example 5. The negative reference voltage generating circuit of FIG. 12 includes resistors R61 and R62, and a differential amplifier 60. The negative reference voltage NVref generated by the negative reference voltage generating circuit of FIG. 12 is represented by the following equation.

$$NVref = -PVref \times R62/R61 \quad (6)$$

In the control circuit of the aforementioned conventional examples, the following problem exists. That is, the negative reference voltage is obtained from the positive reference voltage PVref, and thus in addition to the accuracy of the positive reference voltage PVref, some errors are added. The control circuits of the conventional examples are divided into the following two types.

(Type 1 (FIG. 11)) The reference current Iref is generated from the positive reference voltage PVref, and the negative reference voltage NVref is generated as Iref·R based on the reference current Iref (see Patent Literature 4, for example). In this case, because the current mirror is used, the operation conditions are not completely the same. Therefore, further errors occur and an extra offset of the differential amplifier is added.

(Type 2 (FIG. 12)) A circuit that compares the positive reference voltage PVref and the negative reference voltage NVref is used, and the positive reference voltage PVref from an antenna power source is used to generate the inverted negative reference voltage NVref. In this case, the positive reference voltage PVref is used as the power source. Therefore, an error of the generation and an error of voltage drop due to current subtraction are added.

FIG. 13 is a circuit diagram showing a structure of the BGR type positive reference voltage generating circuit of Comparative Example 1. In FIG. 13, the BGR type positive reference voltage generating circuit of Comparative Example 1 includes:
(1) a differential amplifier 1, i.e., an operational amplifier;
(2) a feedback resistor Rc connected between an output terminal and a non-inverting input terminal of the differential amplifier 1;
(3) a feedback resistor Rc connected between the output terminal and an inverting input terminal of the differential amplifier 1;
(4) a diode Dc having an anode connected with the non-inverting input terminal of the differential amplifier 1 and a cathode connected with a ground; and
(5) m diodes D1-Dm, each having an anode connected with the inverting input terminal of the differential amplifier 1 via a resistor Rb and a cathode connected with the ground, and the diodes D1-Dm are connected in parallel.

The BGR type positive reference voltage generating circuit of Comparative Example 1 configured in the aforementioned manner generates a positive reference voltage Vbgr from the output terminal of the differential amplifier 1 and outputs the same.

FIG. 14A is a circuit diagram showing a structure of the BGR type positive reference voltage generating circuit of Comparative Example 2. FIG. 14B is a vertical cross-sectional view showing a structure of each PNP type transistor of the BGR type positive reference voltage generating circuit of FIG. 14A. In FIG. 14A, the BGR type positive reference voltage generating circuit of Comparative Example 2 is different from the BGR type positive reference voltage generating circuit of FIG. 13 in the following aspects.
(1) a PNP type transistor Qc connected as a diode is provided in place of the diode Dc.
(2) m PNP type transistors Q1-Qm are provided in place of the parallel circuit of the diodes D1-Dm. The m PNP type transistors Q1-Qm are connected in parallel and diode-connected independently.

In FIG. 14B, an N type dopant, such as phosphorus, is implanted into a P type semiconductor substrate 10 to form a N well 11, and a PNP type transistor having an emitter E, a base B, and a collector C is formed.

The same as Comparative Example 1, the BGR type positive reference voltage generating circuit of Comparative Example 2 configured in the aforementioned manner generates the positive reference voltage Vbgr from the output terminal of the differential amplifier 1 and outputs the same.

Nevertheless, the BGR type positive reference voltage generating circuits of Comparative Examples 1 and 2 have the problem of being unable to generating the negative reference voltage.

SUMMARY OF THE INVENTION

In view of the above, the invention provides a negative reference voltage generating circuit and a negative reference voltage generating system which generate a negative reference voltage with high accuracy and have a simple circuit structure, compared with the conventional technology.

A negative reference voltage generating circuit of the invention generates a negative reference voltage with a bandgap reference, and the negative reference voltage generating circuit includes:
a differential amplifier including a non-inverting input terminal, an inverting input terminal, and an output terminal, wherein the differential amplifier is driven by a positive power voltage and a negative power voltage, and the output terminal is connected with the non-inverting input terminal via a first resistor and is connected with the inverting input terminal via a second resistor;
a first diode including a cathode and an anode, wherein the cathode is connected with the non-inverting input terminal of the differential amplifier and the anode is connected with a ground;
a plurality of second diodes each including a cathode and an anode, wherein the cathode is connected with a predetermined connection point and the anode is connected with the ground, and the second diodes are connected in parallel; and
a third resistor connected between the predetermined connection point and the inverting input terminal of the differential amplifier.

Regarding the negative reference voltage generating circuit, the first diode and the second diodes are formed by implanting a P type dopant into a semiconductor substrate to form a P well, forming an N+ doped region in a central portion of the P well to form the cathode, and forming a P+ doped region at a position around the cathode to form the anode.

Here, a substrate tap is formed by forming the P+ doped region in the semiconductor substrate located outside the first diode and the second diodes.

Regarding the negative reference voltage generating circuit, the first diode and the second diodes are formed by implanting an N type dopant into a semiconductor substrate to form an N well, implanting a P type dopant into the N well to form a P well, forming an N+ doped region in a central portion of the P well to form the cathode, and forming a P+ doped region at a position around the cathode to form the anode.

Here, a first substrate tap is formed by forming the N+ doped region in the N well and a second substrate tap is formed by forming the P+ doped region in the semiconductor substrate.

In the negative reference voltage generating circuit, each of the first diode and the second diodes are a diode between a base and an emitter of an NPN type transistor having a triple well structure.

Here, the first diode and the second diodes are formed by implanting the N type dopant into the semiconductor substrate to form the N well, implanting the P type dopant into the N well to form in the P well, forming the N+ doped region in the central portion of the P well to form the emitter, and forming the P+ doped region at a position around the emitter to form the base; and further the NPN type transistor is formed by forming the N+ doped region at a position around the base to form the collector.

Moreover, the first substrate tap is formed by forming the N+ doped region in the N well and the second substrate tap is formed by forming the P+ doped region in the semiconductor substrate.

In the negative reference voltage generating circuit, a positive power terminal of the differential amplifier is applied with a predetermined positive power voltage Vdd or a ground voltage. A negative power terminal of the differential amplifier is applied with a predetermined negative power voltage Vnn.

Regarding the negative reference voltage generating circuit, the differential amplifier includes a plurality of NMOS transistors having a triple well structure, and the triple well structure is formed by forming a P well in an N well formed in a P type semiconductor substrate and forming a plurality of electrode doped regions in the P well.

Here, the N well is applied with the predetermined positive power voltage Vdd or the ground voltage.

A negative reference voltage generating system of the invention includes: the negative reference voltage generating circuit; and a negative voltage generating circuit including a charge pump, generating a predetermined negative power voltage, and supplying the predetermined negative power voltage as a negative power voltage to the negative reference voltage generating circuit.

The negative reference voltage generating system further includes: a control circuit controlling the negative power voltage outputted from the negative voltage generating circuit by using a predetermined reference voltage, so as to reduce a variation of the negative power voltage.

The negative reference voltage generating system further includes: a control circuit controlling the negative power voltage by using a negative reference voltage that is outputted from the negative reference voltage generating circuit, as a reference voltage, to reduce a variation of the negative power voltage based on the negative power voltage outputted from the negative voltage generating circuit.

Thus, the negative reference voltage generating circuit and the negative reference voltage generating system of the invention are capable of generating a negative reference voltage with high accuracy and have a simple circuit structure, compared with the conventional technology.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1A:
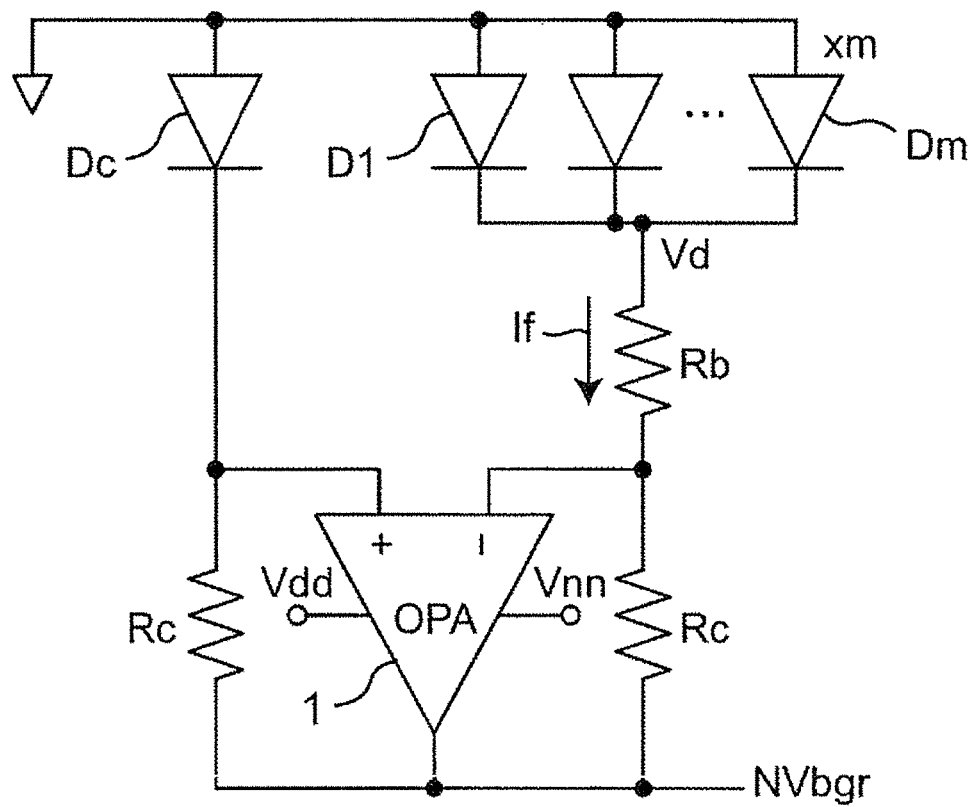
FIG. 1A is a circuit diagram showing a structure of the BGR type negative reference voltage generating circuit of Embodiment 1.

Embodiments of the invention are described hereinafter with reference to the figures. In the following embodiments, identical components/elements are assigned with the same reference numerals.

FIG. 1A is a circuit diagram showing a structure of a BGR type negative reference voltage generating circuit of Embodiment 1. In FIG. 1A, the BGR type negative reference voltage generating circuit of Embodiment 1 includes:

(1) a differential amplifier 1, i.e. an operational amplifier, to which a positive power voltage Vdd and a negative power voltage Vnn are respectively supplied via a positive power terminal and a negative power terminal;

(2) a feedback resistor Rc connected between an output terminal and a non-inverting input terminal of the differential amplifier 1;

(3) a feedback resistor Rc connected between the output terminal and an inverting input terminal of the differential amplifier 1;

(4) a diode Dc having a cathode connected with the non-inverting input terminal of the differential amplifier 1 and an anode connected with a ground; and (5) in diodes D1-Dm each having a cathode connected with the inverting input terminal of the differential amplifier 1 via a resistor Rb and an anode connected with the ground, wherein the diodes D1-Dm are connected in parallel.

Here, the resistors Rc, Rc, and Rb are composed of polysilicon resistors, for example.

The BGR type negative reference voltage generating circuit of Embodiment 1 configured in the aforementioned manner generates a negative reference voltage NVbgr from the output terminal of the differential amplifier 1 and outputs the same. The BGR type negative reference voltage generating circuit is formed based on the general BGR type positive reference voltage generating circuit of FIG. 13, but requires the negative power voltage Vim. Therefore, a negative voltage charge pump circuit that generates the negative reference voltage also needs to be disposed.

Figure 1B:
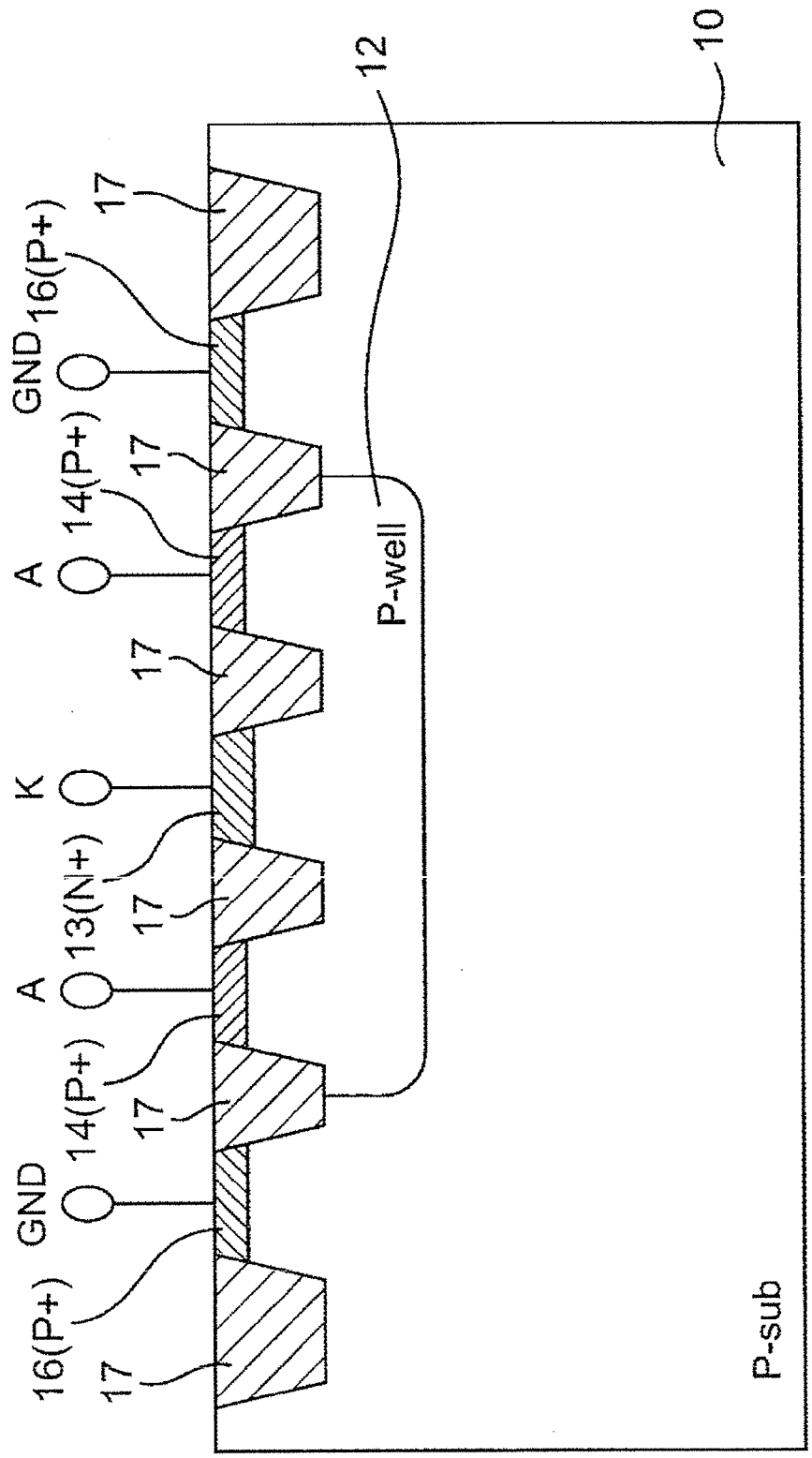
FIG. 1B is a vertical cross-sectional view showing a structural example of the diodes D1-Dm and Dc of the BGR type negative reference voltage generating circuit of FIG. 1A.
Figure 13:
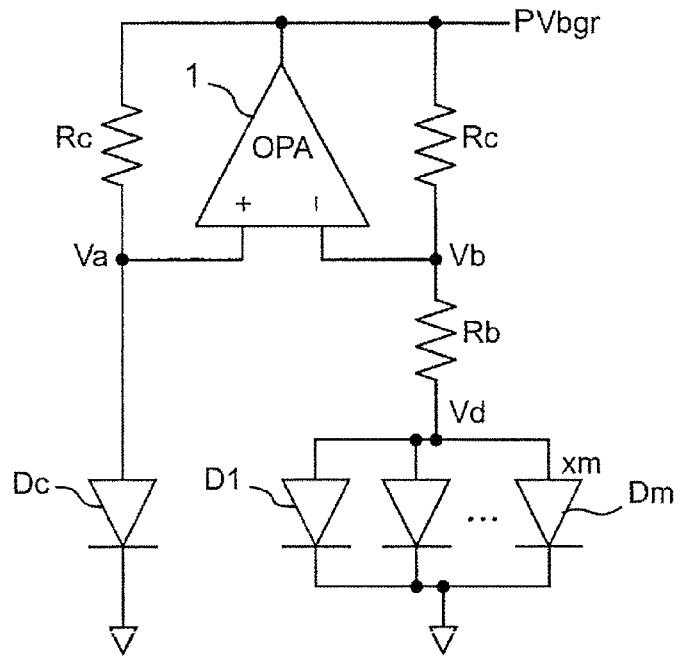
FIG. 13 is a circuit diagram showing a structure of the BGR type positive reference voltage generating circuit of Comparative Example 1.

FIG. 1B is a vertical cross-sectional view showing a structural example of the diodes D1-Dm and Dc of the BGR type negative reference voltage generating circuit of FIG. 1A. The BGR type reference voltage generating circuit of the positive reference voltage of FIG. 13 is to be used an N well instead of a P well, and thus needs to use the parasitic diode between the base and emitter of the PNP type transistor as shown in FIG. 14. However, this example can be manufactured using a simple diode structure. In FIG. 1B, a P type dopant, such as boron, is implanted into the P type semiconductor substrate 10 to form a P well 12. The P well 12 is not necessary but can reduce the resistance between an anode A and a cathode K. Generally, the anode A and a substrate tap GND are formed around the cathode K.

In addition, an N+ dopant is implanted into a P well 12 of FIG. 1B to form an N+ doped region 13 to constitute the cathode K, and a P+ dopant is implanted to form a P+ doped region 14 to constitute the anode A. Moreover, a P+ dopant is implanted into the P type semiconductor substrate 10 to form a P+ doped region 16 to constitute the substrate tap GND. Further, the terminals are separated by an insulating region 17 having a shallow trench isolation (STI) structure.

Figure 1C:
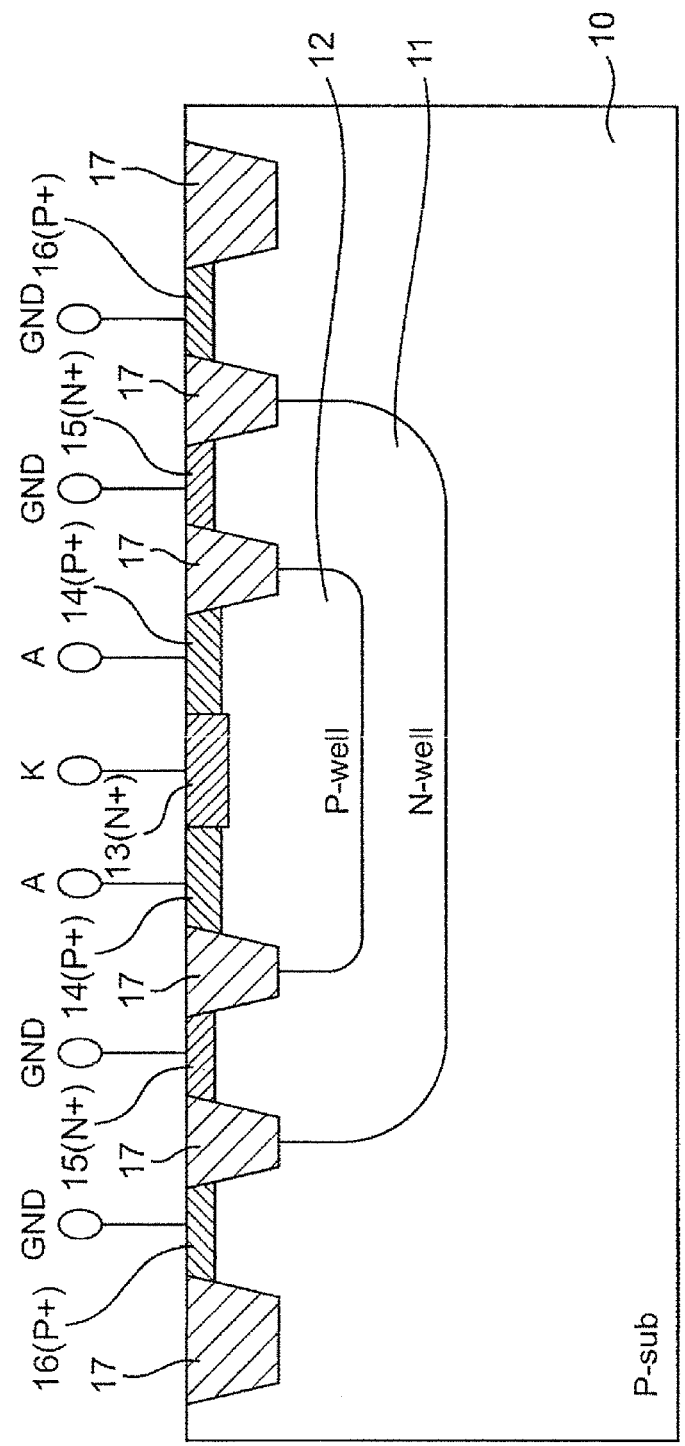
FIG. 1C is a vertical cross-sectional view showing an example of manufacturing the diodes D1-Dm and Dc of the BGR type negative reference voltage generating circuit of FIG. 1A based on a triple well structure.

FIG. 1C is a vertical cross-sectional view showing an example of manufacturing the diodes D1-Dm and Dc of the BGR type negative reference voltage generating circuit of FIG. 1A based on a triple well structure. An N type dopant, such as phosphorus, is implanted into the P type semiconductor substrate 10 to form the N well 11, and a P type dopant, such as boron, is implanted into the N well 11 to form the P well 12, so as to form the triple well structure. An N+ dopant is implanted into the P well 12 to form the N+ doped region 13 and an electrode is connected to serve as the cathode K, and a P+ dopant is implanted into the P well 12 to form the P+ doped region 14 and an electrode is connected to serve as the anode A. Moreover, an N+ dopant is implanted into the N well 11 to form an N+ doped region 15, and an electrode connected with the doped region 15 is connected with the substrate tap GND. Further, a P+ dopant is implanted into the P type semiconductor substrate 10 to form a P+ doped region 16, and an electrode connected with the doped region 16 is connected with the substrate tap GND. Here, the P+ doped region 14 is formed in contact with and around the N+ doped region 13. That is, the cathode K is formed to be surrounded by the anode A. The above is to minimize the effect of the parasitic NPN type transistor, which sets the N+ doped region 13 as the emitter, the P well 12 as the base, and the N well 11 as the collector.

In the BGR type negative reference voltage generating circuit of FIG. 1A, if a feedback current flowing to the resistor Rb is set to If and a cathode voltage of each of the diodes D1-Dm is set to Vd, the negative reference voltage NVbgr outputted by the differential amplifier 1 is represented by the following equation.

$$NVbgr = If \times (Rc+Rb) + Vd \qquad (7)$$

Here, the diode current If and the cathode voltage Vd are represented by the following equations.

$$If = kT/q \times (1/Rb) \times \mathrm{Ln}(m)$$

$$Vd = kT/q \times \mathrm{Ln}(If/Is/m)$$

Here, k represents a Boltzmann constant, T represents an absolute temperature, q represents an elementary charge, and Is represents a reverse saturation current of the diode.

Temperature dependence can be removed if the following equation is satisfied.

[Equation 1]

$$\frac{R_c + R_b}{R_b} = -\frac{q}{k \times L_n(m)} \frac{\partial V_d}{\partial T} \qquad (8)$$

As described above, according to Embodiment 1, the negative reference voltage generating circuit is provided, which generates the negative reference voltage with high accuracy and has simple circuit structure as compared with the conventional technology.

Embodiment 2

Figure 2A:
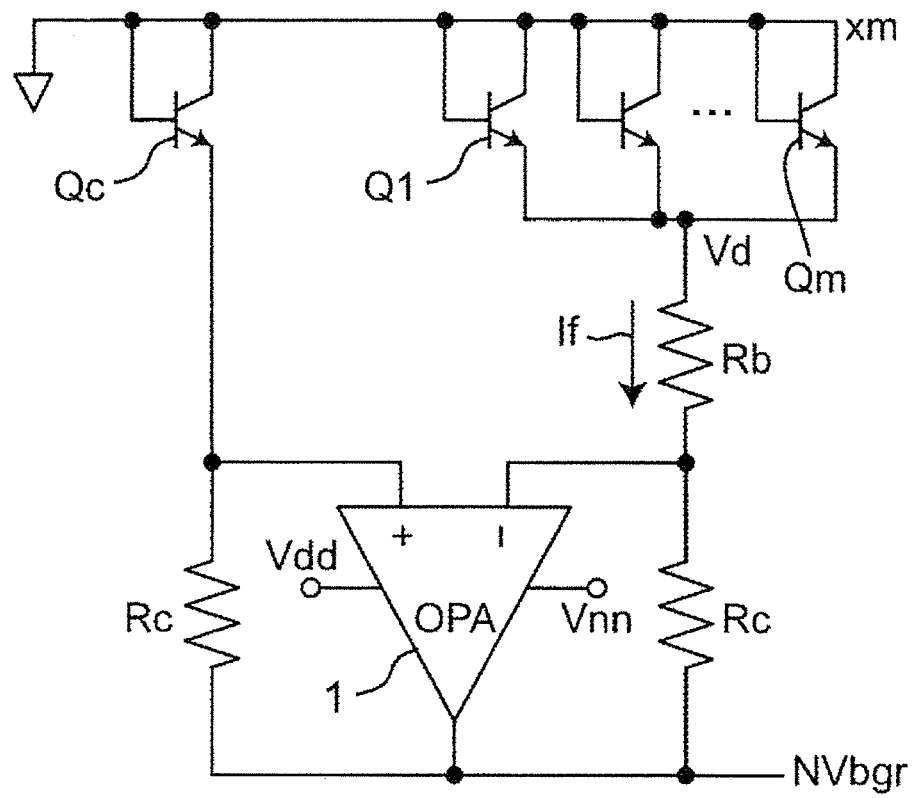
FIG. 2A is a circuit diagram showing a structure of the BGR type negative reference voltage generating circuit of Embodiment 2.

FIG. 2A is a circuit diagram showing a structure of the BGR type negative reference voltage generating circuit of Embodiment 2. The BGR type negative reference voltage generating circuit of Embodiment 2 is different from the BGR type negative reference voltage generating circuit of Embodiment 1 in the following aspects.

(1) a NPN type transistor Qc with diode connection is provided in place of the diode Dc.

(2) m NPN type transistors Q1-Qm respectively with diode connection are provided in place of the diodes D1-Dm.

Figure 2B:
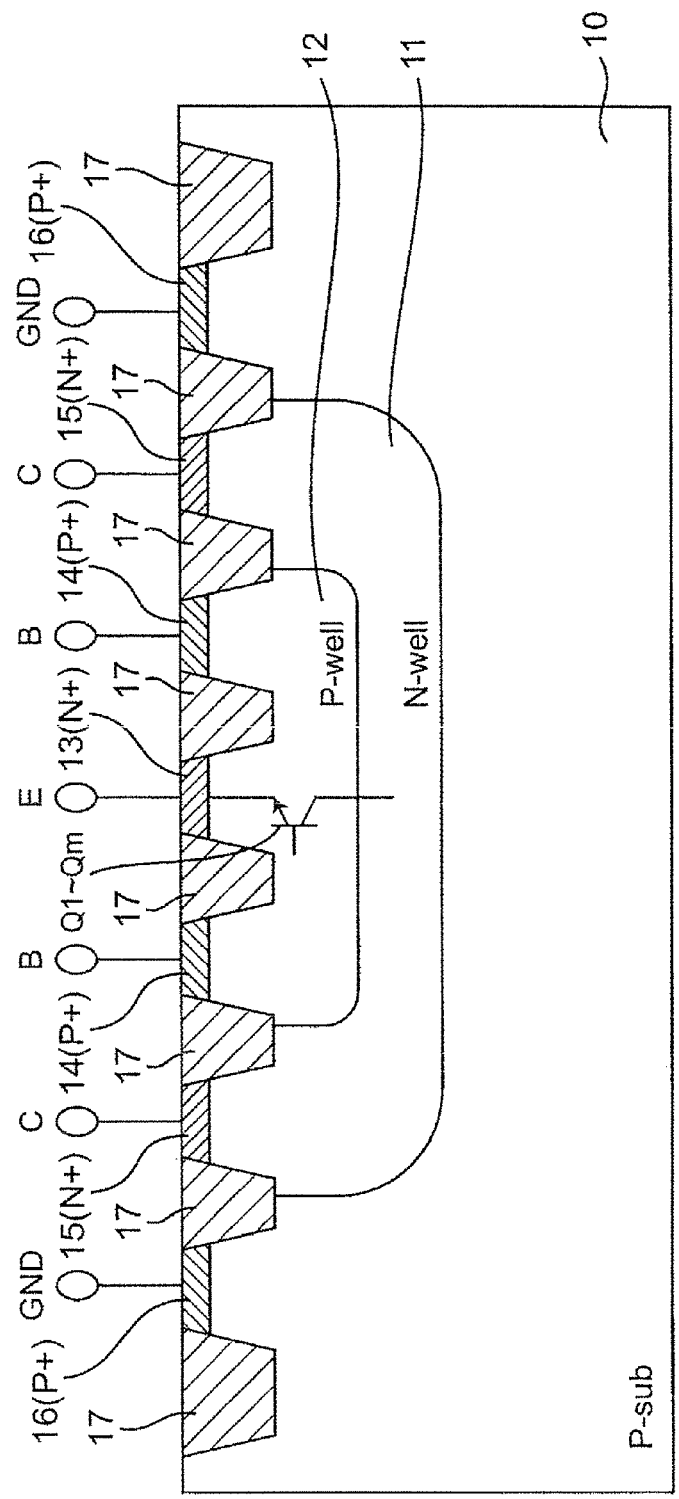
FIG. 2B is a vertical cross-sectional view showing a triple well structure of NPN type transistors Q1-Qm and Qc of the BGR type negative reference voltage generating circuit of FIG. 2A.

FIG. 2B is a vertical cross-sectional view showing a triple well structure of the NPN type transistors Q1-Qm and Qc of the BGR type negative reference voltage generating circuit of FIG. 2A. Each of the NPN type transistors Q1-Qm and Qc has the structure as shown in FIG. 2B, for example. In FIG. 2B, an N type dopant, such as phosphorus, is implanted into the P type semiconductor substrate 10 to form the N well 11, and a P type dopant, such as boron, is implanted into the N well 11 to form the P well 12. Moreover, an N+ dopant is implanted into the P well 12 to form the N+ doped region 13 and an electrode is connected to serve as the emitter, and a P+ dopant is implanted into the P well 12 to form the P+ doped region 14 and an electrode is connected to serve as the base. An N+ dopant is implanted into the N well 11 to form the N+ doped region 15 and an electrode is connected to serve as the collector. Further, a P+ dopant is implanted into the P type semiconductor substrate 10 to form the P+ doped region 16 and an electrode is formed to serve as the ground-connecting substrate tap. Based on the above, the NPN type transistors Q1-Qm and Qc can be formed.

In the BGR type negative reference voltage generating circuit configured in the aforementioned manner, as clearly shown in FIG. 2B, the parasitic PNP type transistor is also forming between the base-collector-substrate of each of the NPN type transistors Q1-Qm and Qc. Therefore, it is possible that current may flow to the parasitic transistor and thus should be noted. In this embodiment, the base B, the collector C, and the P type semiconductor substrate are all 0V (GND). Therefore, there is no need to worry. However, it is preferable to form the emitter E to be surrounded by the base B, the collector C, and the substrate tap. In addition, generally, the terminals are separated by the insulating region 17 having a STI (shallow trench isolation) structure.

As described above, according to Embodiment 2, the negative reference voltage generating circuit is provided, which operates the same as Embodiment 1, and generates the negative reference voltage with high accuracy and has a simple circuit structure as compared with the conventional technology.

Embodiment 3

Figure 3A:
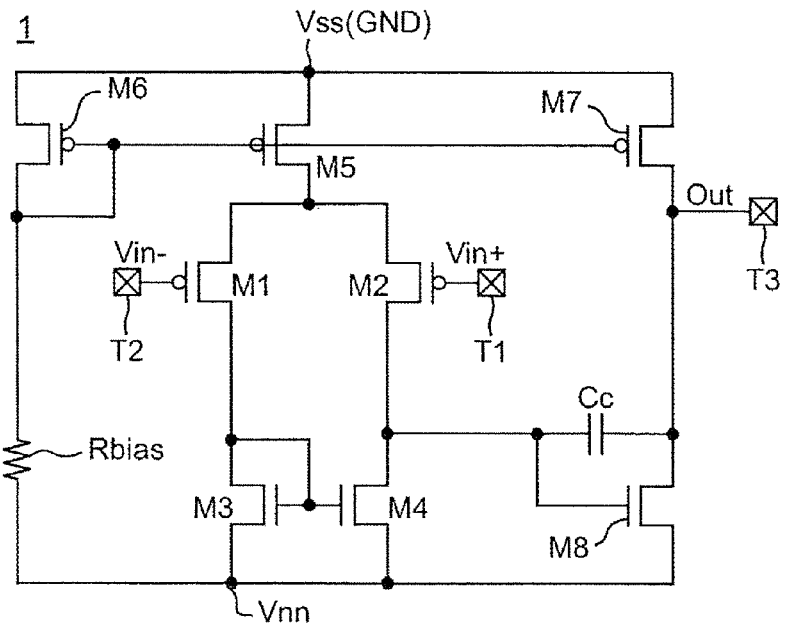
FIG. 3A is a circuit diagram showing a structural example of the differential amplifier 1, operated by a negative voltage, of Embodiment 3.

FIG. 3A is a circuit diagram showing a structural example of the differential amplifier 1, operated by a negative voltage, of Embodiment 3. In FIG. 3A, the differential amplifier 1 is an operational amplifier and includes MOS transistors M1-M8, a bias resistor Rbias, a phase compensation capacitor Cc, input terminals T1 and T2, and an output terminal T3. The positive power voltage terminal of the differential amplifier 1 is set to the ground voltage Vss (may also be the positive power voltage Vdd as shown in FIG. 1A or FIG. 2A). The differential amplifier 1 differentially amplifies a differential input voltage inputted to the non-inverting input terminal T1 and the inverting input terminal T2, and outputs the same from the output terminal T3. Here, Vss is the ground voltage and Vnn is a predetermined negative voltage.

The differential amplifier 1 used in Embodiment 1 and Embodiment 2 needs to be operated by the negative power voltage Vnn. The initial negative power voltage Vnn and the BGR output voltage are at a ground level (Vss level). At the moment, the negative power voltage Vim is supplied by the charge pump, for example. Thus, it is important to prevent phenomena, such as latch-up effect, resulting from noise that occurs when the operation starts.

Figure 3B:
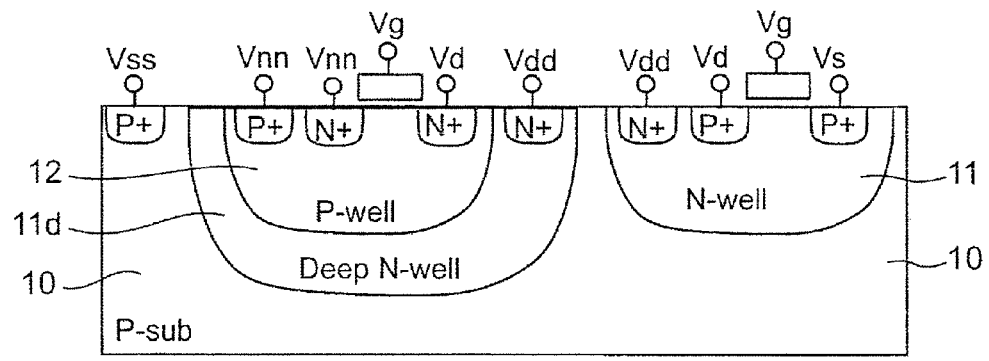
FIG. 3B is a vertical cross-sectional view showing a structure of each MOS transistor of the differential amplifier 1 of FIG. 3A.

FIG. 3B is a vertical cross-sectional view showing the triple well structure of each MOS transistor of the differential amplifier 1 of FIG. 3A. In FIG. 3B, the MOS transistors on the right side are PMOS transistors M1, M2, and M5-M7, and the MOS transistors on the left side are NMOS transistors M3, M4, and M8. The N well 11 of the PMOS transistors M1, M2, and M5-M7 and the deep N well 11d of the NMOS transistors M3, M4, and M8 are biased to the positive power voltage Vdd. Accordingly, when the negative power voltage Vim is supplied from the charge pump, for example, phenomena, such as latch-up effect, resulting from noise that occurs when the operation starts can be prevented.

Embodiment 4

Figure 4:
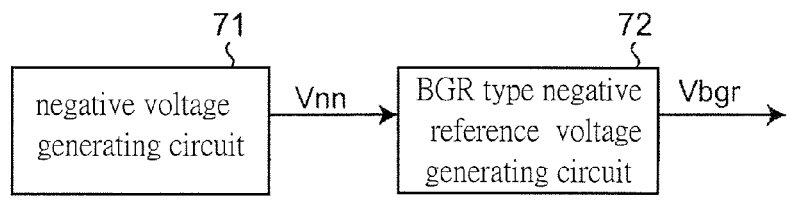
FIG. 4 is a block diagram showing a structural example of the negative reference voltage generating system of Embodiment 4.

FIG. 4 is a block diagram showing a structural example of a negative reference voltage generating system of Embodiment 4. The BGR type negative reference voltage generating circuit of Embodiment 1 or Embodiment 2 requires the negative power voltage Vim, which needs to be generated from the positive power voltage Vdd. In FIG. 4, the negative reference voltage generating system of Embodiment 4 includes a negative voltage generating circuit 71 and a BGR type negative reference voltage generating circuit 72 as described in Embodiment 1 or Embodiment 2, for example. Here, the negative voltage generating circuit 71 does not include an output voltage controller and can generate a negative voltage around −Vdd by a one-stage charge pump driven by the positive power voltage Vdd or a switched capacitor converter driven by the positive power voltage Vdd.

Embodiment 5

Figure 5:
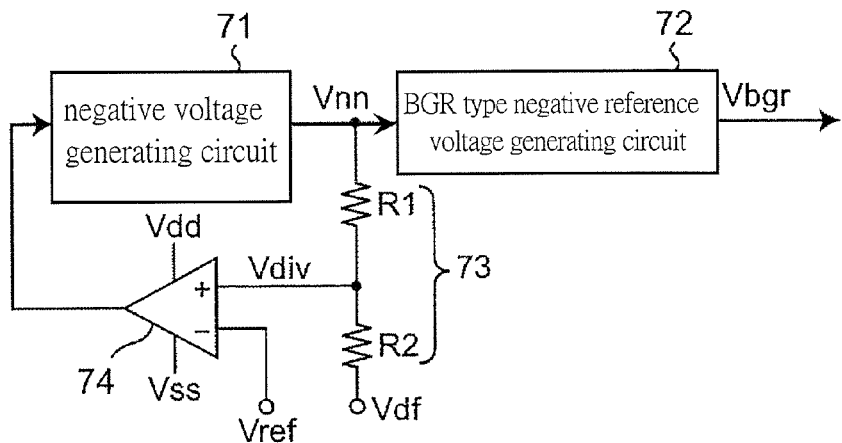
FIG. 5 is a block diagram showing a structural example of the negative reference voltage generating system of Embodiment 5.

FIG. 5 is a block diagram showing a structural example of the negative reference voltage generating system of Embodiment 5. The negative reference voltage generating system of Embodiment 5 is characterized in further including: a resistor dividing voltage circuit 73, which includes resistors R1 and R2, and a differential amplifier 74, which is an operational amplifier, for example, in addition to the negative voltage generating circuit 71 and the BGR type negative reference voltage generating circuit 72 of Embodiment 1 or Embodiment 2. Here, another end of the resistor R2 is connected with a voltage source of a power voltage Vdf, and the inverting input terminal of the differential amplifier 74 is connected with a reference voltage source of the reference voltage Vref. The voltages Vdf and Vref may be the following voltages.

Figure 14A:
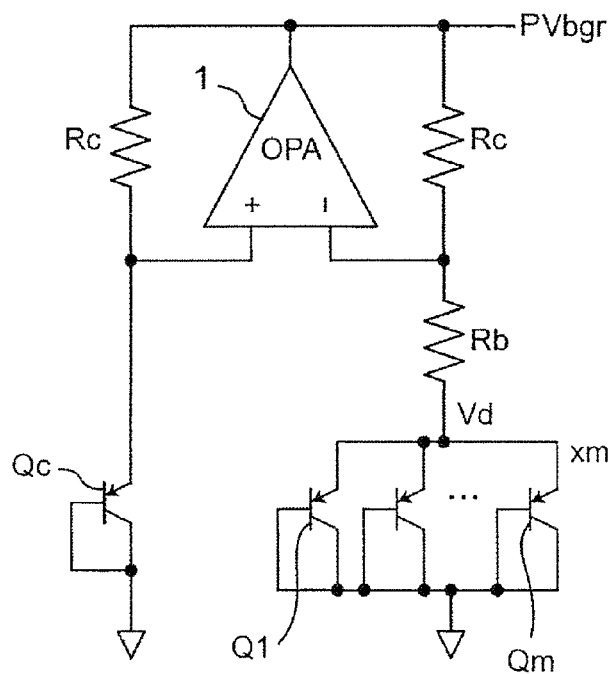
FIG. 14A is a circuit diagram showing a structure of the BGR type positive reference voltage generating circuit of Comparative Example 2.
Figure 14B:
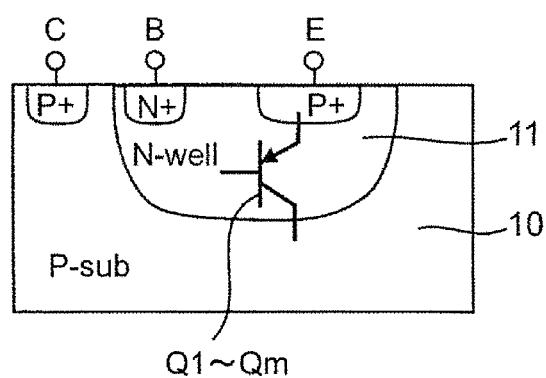
FIG. 14B is a vertical cross-sectional view showing a structure of each PNP type transistor of the BGR type positive reference voltage generating circuit of FIG. 14A.

(1) Vdf=the positive power voltage Vdd, or the positive reference voltage PVref generated by the positive reference voltage generating circuit of FIG. 13 or FIG. 14A, for example (2) Vref=the positive reference voltage PVref generated by the positive reference voltage generating circuit of FIG. 13 or FIG. 14A, or 0V (Vss), for example.

Moreover, the power voltage of the differential amplifier 74 uses the positive power voltage Vdd and the ground voltage Vss.

In FIG. 5, the voltage between the negative power voltage Vim from the negative voltage generating circuit 71 and the voltage Vdf is divided by the resistor dividing circuit 73, and the divided voltage is applied to the non-inverting input terminal of the differential amplifier 74. The reference voltage Vref is applied to the inverting input terminal of the differential amplifier 74, and the differential amplifier 74 outputs the voltage indicating the inputted two voltage differences to the negative voltage generating circuit 71. The negative voltage generating circuit 71 generates the negative power voltage Vnn based on the inputted voltage differences and outputs the same. With the aforementioned configuration, the differential amplifier 74 performs feedback control on the negative voltage generating circuit 71 and thereby suppresses variation of the negative power voltage Vnn.

Embodiment 6

Figure 6:
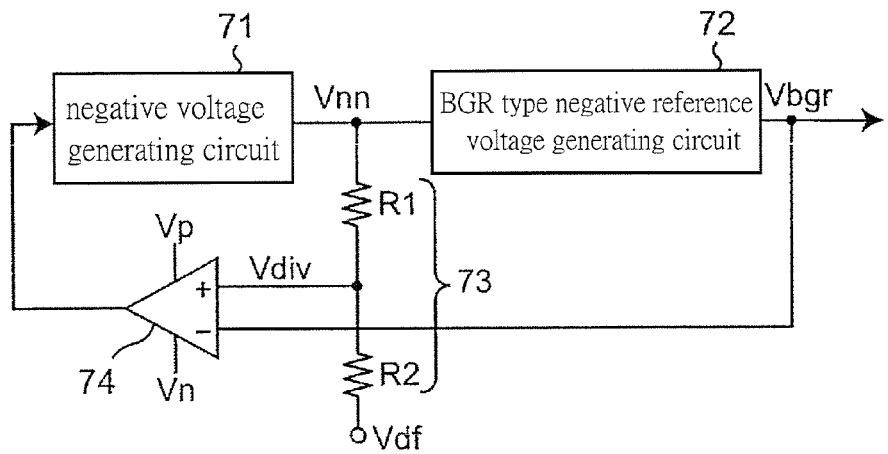
FIG. 6 is a block diagram showing a structural example of the negative reference voltage generating system of Embodiment 6.
Figure 7A:
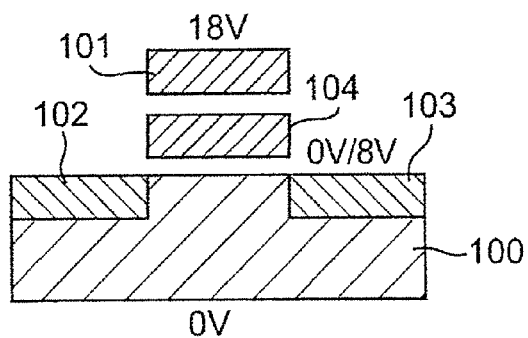
FIG. 7A is a vertical cross-sectional view of the NOR type flash memory cell of Conventional Example 1, which shows the voltage relationship required for performing the Fowler-Nordheim programming/erasing operations at the maximum voltage of 18V.
Figure 7B:
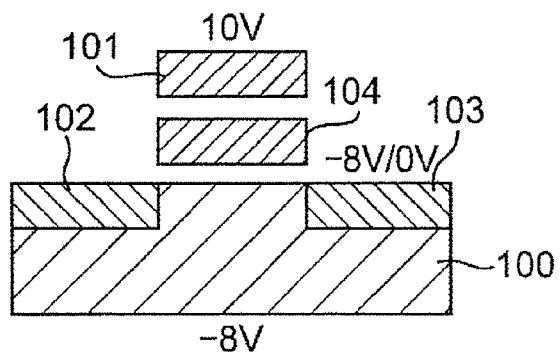
FIG. 7B is a vertical cross-sectional view of the NOR type flash memory cell of Conventional Example 1, which shows the voltage relationship required for performing the Fowler-Nordheim programming/erasing operations at the maximum voltage of 10V.
Figure 8:
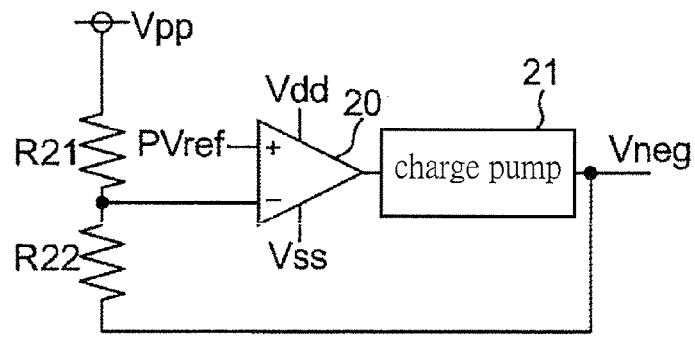
FIG. 8 is a circuit diagram showing a structure of the negative voltage generating circuit of Conventional Example 2.
Figure 9:
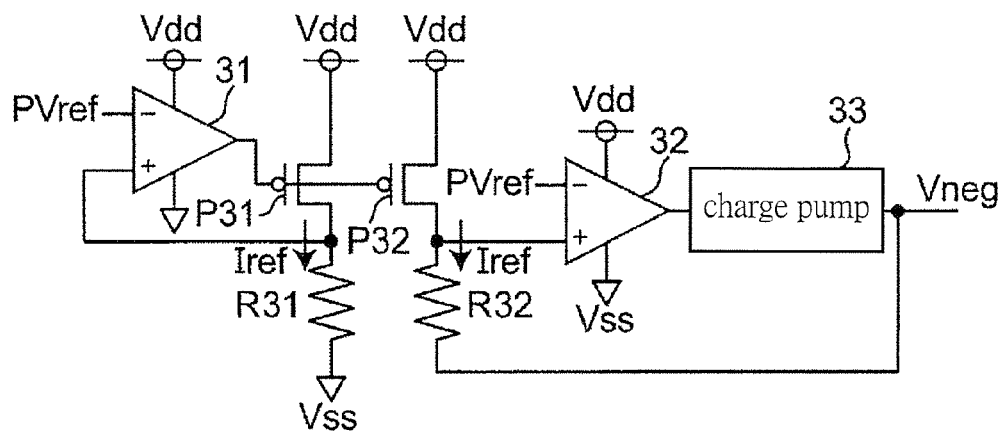
FIG. 9 is a circuit diagram showing a structure of the negative voltage generating circuit of Conventional Example 3.
Figure 10:
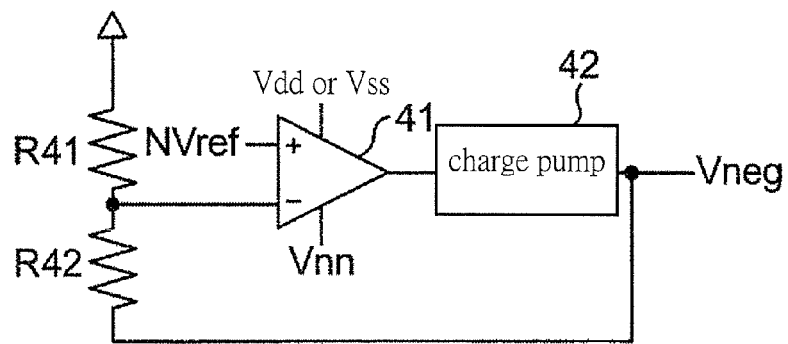
FIG. 10 is a circuit diagram showing a structural example of the negative voltage generating circuit using a negative reference voltage.
Figure 11:
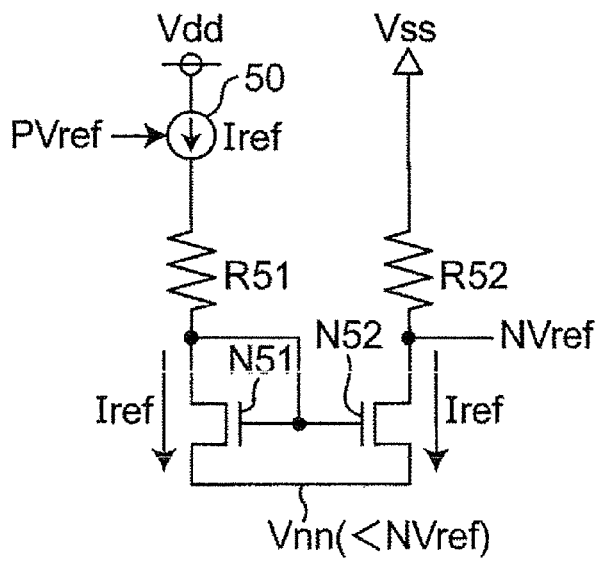
FIG. 11 is a circuit diagram showing a structure of the negative reference voltage generating circuit of Conventional Example 4.
Figure 12:
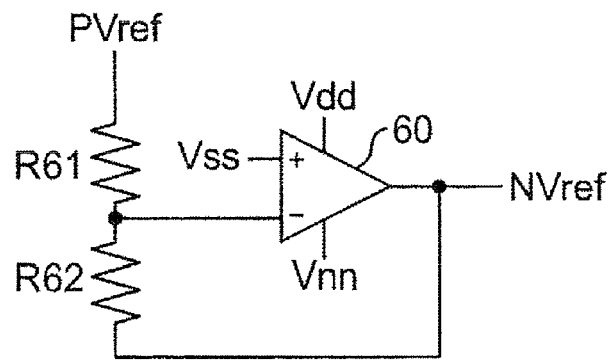
FIG. 12 is a circuit diagram showing a structure of the negative reference voltage generating circuit of Conventional Example 5.

FIG. 6 is a block diagram showing a structural example of the negative reference voltage generating system of Embodiment 6. The negative reference voltage generating system of Embodiment 6 is different from the negative reference voltage generating system of Embodiment 5 in the following aspects.

(1) The negative reference voltage Vbgr outputted from the BGR type negative reference voltage generating circuit 72 is used in place of the reference voltage Vref applied to the inverting input terminal of the differential amplifier 74.

(2) The voltage Vdd/Vss, the voltage Vss/Vnn or the voltage Vdd/Vnn can be used as the power voltage Vp/Vn of the differential amplifier 74.

With the aforementioned configuration, the negative reference voltage Vbgr is used as the reference voltage of the differential amplifier 74, and the differential amplifier 74 performs feedback control on the negative voltage generating circuit 71, thereby suppressing variation of the negative power voltage Vnn.

As described above, the negative reference voltage generating circuit according to the embodiment and the negative reference voltage generating system using the negative reference voltage generating circuit achieve the following specific effects: being capable of generating the negative reference voltage with extremely high accuracy and high precision relative to the temperature change and having a simple circuit structure, compared with the conventional technology.

As specified above, the negative reference voltage generating circuits and the negative reference voltage generating systems of the invention are capable of generating the negative reference voltage with high accuracy and have a simple circuit structure, compared with the conventional technology. The negative reference voltage generating circuits and the negative reference voltage generating systems of the invention are applicable to a non-volatile memory device such as a NOR type flash memory, or a dynamic random access memory (DRAM), etc.

What is claimed is:

1. A negative reference voltage generating circuit generating a negative reference voltage with a bandgap reference, the negative reference voltage generating circuit comprising:
    a differential amplifier comprising a non-inverting input terminal, an inverting input terminal, and an output terminal, wherein the differential amplifier is driven by a positive power voltage and a negative power voltage, and the output terminal is connected with the non-inverting input terminal via a first resistor and is connected with the inverting input terminal via a second resistor;
    a first diode comprising a cathode and an anode, wherein the cathode is connected with the non-inverting input terminal of the differential amplifier and the anode is connected with a ground;
    a plurality of second diodes each comprising a cathode and an anode, wherein the cathode is connected with a predetermined connection point and the anode is connected with the ground, and the second diodes are connected in parallel; and
    a third resistor connected between the predetermined connection point and the inverting input terminal of the differential amplifier.

2. The negative reference voltage generating circuit according to claim 1, wherein:
    the first diode and the second diodes are formed by implanting a P type dopant into a semiconductor substrate to form a P well, forming an N+ doped region in a central portion of the P well to form the cathode, and forming a P+ doped region at a position around the cathode to form the anode.

3. The negative reference voltage generating circuit according to claim 2, wherein:
    a substrate tap is formed by forming the P+ doped region in the semiconductor substrate located outside the first diode and the second diodes.

4. The negative reference voltage generating circuit according to claim 1, wherein:
    the first diode and the second diodes are formed by implanting an N type dopant into a semiconductor substrate to form an N well, implanting a P type dopant into the N well to form a P well, forming an N+ doped region in a central portion of the P well to form the cathode, and forming a P+ doped region at a position around the cathode to form the anode.

5. The negative reference voltage generating circuit according to claim 4, wherein:
    a first substrate tap is formed by forming the N+ doped region in the N well and a second substrate tap is formed by forming the P+ doped region in the semiconductor substrate.

6. The negative reference voltage generating circuit according to claim 1, wherein:
    each the first diode and the second diodes is a diode between a base and an emitter of an NPN type transistor having a triple well structure.

7. The negative reference voltage generating circuit according to claim 6, wherein:
    the first diode and the second diodes are formed by implanting an N type dopant into the semiconductor substrate to form an N well, implanting a P type dopant into the N well to form a P well, forming an N+ doped region in the central portion of the P well to form the emitter, and forming a P+ doped region at a position around the emitter to form the base; and further the NPN type transistor is formed by forming the N+ doped region at a position around the base to form the collector.

8. The negative reference voltage generating circuit according to claim 7, wherein:
    a first substrate tap is formed by forming the N+ doped region in the N well and a second substrate tap is formed by forming the P+ doped region in the semiconductor substrate.

9. The negative reference voltage generating circuit according to claim 1, wherein:
    a positive power terminal of the differential amplifier is applied with a predetermined positive power voltage or a ground voltage; and
    a negative power terminal of the differential amplifier is applied with a predetermined negative power voltage.

10. The negative reference voltage generating circuit according to claim 1, wherein:
    the differential amplifier comprises a plurality of NMOS transistors having a triple well structure, and the triple well structure is formed by forming a P well in an N well formed in a P type semiconductor substrate and forming a plurality of electrode doped regions in the P well.

11. The negative reference voltage generating circuit according to claim 10, wherein:
    the N well is applied with the predetermined positive power voltage or the ground voltage.

12. A negative reference voltage generating system, comprising:
    the negative reference voltage generating circuit of claim 1; and
    a negative voltage generating circuit comprising a charge pump, generating a predetermined negative power voltage, and supplying the predetermined negative power voltage as a negative power voltage to the negative reference voltage generating circuit.

13. The negative reference voltage generating system according to claim 12, further comprising:
    a control circuit controlling the negative power voltage outputted from the negative voltage generating circuit by using a predetermined reference voltage, so as to reduce a variation of the negative power voltage.

14. The negative reference voltage generating system according to claim 12, further comprising:
a control circuit controlling the negative power voltage by using a negative reference voltage that is outputted from the negative reference voltage generating circuit, as a reference voltage, based on the negative power voltage outputted from the negative voltage generating circuit, so as to reduce a variation of the negative power voltage.

* * * * *